US010147361B2

(12) United States Patent
Gu et al.

(10) Patent No.: US 10,147,361 B2
(45) Date of Patent: *Dec. 4, 2018

(54) DISPLAY DEVICES AND METHODS FOR MAKING AND DRIVING THE SAME

(71) Applicant: KUNSHAN YUNYINGGU ELECTRONIC TECHNOLOGY CO., LTD., Kunshan, Jiangsu (CN)

(72) Inventors: Jing Gu, Shanghai (CN); Xixi Luo, Shanghai (CN); Keigo Hirakawa, Dayton, OH (US)

(73) Assignee: KUNSHAN YUNYINGGU ELECTRONIC TECHNOLOGY CO., LTD., Kunshan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/667,206

(22) Filed: Aug. 2, 2017

(65) Prior Publication Data
US 2017/0330517 A1 Nov. 16, 2017

Related U.S. Application Data

(62) Division of application No. 14/424,496, filed as application No. PCT/CN2013/070079 on Jan. 5, 2013, now Pat. No. 9,761,166.

(51) Int. Cl.
G09G 3/3283 (2016.01)
H01L 27/32 (2006.01)
(Continued)

(52) U.S. Cl.
CPC ......... G09G 3/3283 (2013.01); G09G 3/2003 (2013.01); G09G 3/325 (2013.01);
(Continued)

(58) Field of Classification Search
CPC ........ G09G 3/005; G09G 3/3233; G09G 3/32; G09G 3/2018; G09G 3/2003; G09G 3/325;
(Continued)

(56) References Cited

U.S. PATENT DOCUMENTS 7,365,719 B2   4/2008  Miyagawa
8,179,350 B2   5/2012  Park et al.
(Continued)

FOREIGN PATENT DOCUMENTS

CN     1670981 A      9/2005
CN   101371619 A      2/2009
(Continued)

OTHER PUBLICATIONS

International Search Report and Written Opinion dated Oct. 17, 2013 in International Patent Application No. PCT/CN2013/070079.
(Continued)

Primary Examiner — Ricardo L Osorio
(74) Attorney, Agent, or Firm — Bayes PLLC

(57) ABSTRACT

Display devices and methods for making and driving the display devices are provided. In one example, a device for driving a display panel including an array of pixels includes a timing controller. Each of the pixels includes a first light emitting element and a second light emitting element. The timing controller is configured to provide a first set of timing control signals for coordinating timing of gate scanning and timing of writing display data into the array of pixels. The timing controller is further configured to provide a second set of timing control signals for controlling timing of emitting light by the first and second light emitting elements of the array of pixels such that the first light emitting elements
(Continued)

emit light in a first light emitting period and the second light emitting elements emit light in a second light emitting period, alternatively.

11 Claims, 21 Drawing Sheets

(51) Int. Cl.
 G09G 3/3233 (2016.01)
 G09G 3/20 (2006.01)
 G09G 3/325 (2016.01)
 G09G 3/3266 (2016.01)
 H01L 51/52 (2006.01)
 H01L 51/56 (2006.01)

(52) U.S. Cl.
 CPC ......... G09G 3/3233 (2013.01); G09G 3/3266 (2013.01); H01L 27/3209 (2013.01); H01L 27/3211 (2013.01); H01L 27/3244 (2013.01); H01L 51/5206 (2013.01); H01L 51/5221 (2013.01); H01L 51/56 (2013.01); G09G 2300/0814 (2013.01); G09G 2300/0852 (2013.01); G09G 2310/0235 (2013.01); G09G 2310/0272 (2013.01); G09G 2310/0278 (2013.01); G09G 2310/0297 (2013.01); G09G 2310/08 (2013.01); G09G 2320/0242 (2013.01); G09G 2340/0457 (2013.01)

(58) Field of Classification Search
 CPC ................ G09G 3/3696; G09G 3/3283; H01L 27/3209; H01L 25/0753
 See application file for complete search history.

(56) References Cited

U.S. PATENT DOCUMENTS

| | | |
|---|---|---|
| 2003/0218173 A1 | 11/2003 | Nishi et al. |
| 2004/0222428 A1 | 11/2004 | Shimomura et al. |
| 2005/0237279 A1 | 10/2005 | Chen et al. |
| 2006/0091974 A1 | 5/2006 | Feldman |
| 2007/0001945 A1 | 1/2007 | Yoshida et al. |
| 2007/0080918 A1 | 4/2007 | Kawachi et al. |
| 2009/0001391 A1 | 1/2009 | Ogihara et al. |
| 2009/0009101 A1 | 1/2009 | Kang et al. |
| 2010/0259164 A1 | 10/2010 | Oohata et al. |
| 2013/0208019 A1 | 8/2013 | Lee et al. |
| 2013/0208021 A1 | 8/2013 | Lee et al. |

FOREIGN PATENT DOCUMENTS

| | | |
|---|---|---|
| CN | 102044554 A | 5/2011 |
| JP | 2000058260 A | 2/2000 |

OTHER PUBLICATIONS

International Preliminary Report on Patentability dated Jul. 7, 2015 in International Patent Application No. PCT/CN2013/070079.
English-language abstract of Chinese Patent Application No. CN 102044554 A; 1 page.
English-language abstract of Japanese Patent Application No. JP 2000058260 A; 2 pages.

DISPLAY DEVICES AND METHODS FOR MAKING AND DRIVING THE SAME

CROSS REFERENCE TO RELATED APPLICATION

This application is divisional of U.S. application Ser. No. 14/424,496, filed on Feb. 27, 2015, entitled "DISPLAY DEVICES AND METHODS FOR MAKING AND DRIVING THE SAME," which is U.S. national phase of International Application No. PCT/CN2013/070079, filed on Jan. 5, 2013, entitled "DISPLAY DEVICES AND METHODS FOR MAKING AND DRIVING THE SAME," all of which are hereby incorporated by reference in their entireties.

BACKGROUND

The present disclosure relates generally to display devices and methods for making and driving the display devices, and more particularly, to display devices having light emitting elements.

Lighting emitting diodes (LEDs), such as organic LEDs (OLEDs), completely solve the problems of narrow viewing angle and light loss because of their self-illuminating nature and thus, are considered as the most promising technology for next-generation display devices. Similar to liquid crystal displays (LCDs), the driving circuits of OLED display devices are fabricated on glass substrates using photolithography techniques. Because OLEDs are current-driven components, which require a relatively higher current level, low temperature polysilicon (LTPS) is usually used as the channel material to satisfy the channel mobility requirement. As the light emitting materials of OLEDs are organic materials, the patterns of the OLEDs are usually defined by evaporation techniques using shadow masks.

FIG. 1 illustrates a side view of a conventional OLED 100 fabricated on a glass substrate 102. An insulating layer 104 is formed on the glass substrate 102. The OLED 100 includes an anode 106 and a cathode 108. From the anode 106 to the cathode 108, a hole injection layer 110, an organic light emitting layer 112, and an electron transport layer 114 are formed in this order. Driving circuit 116 is also formed on the glass substrate 102, which includes driving and switching thin film transistors (TFTs), wires, and vertical interconnect accesses (vias). Depending on the materials used in the organic light emitting layer 112, light of different colors (wavelengths) may be emitted through a cover glass 118.

Multiple OLEDs (sub-pixels) may constitute a single pixel on the display. As shown in FIG. 2, a pixel 200 includes two OLEDs 202, 204, each of which is formed on the glass substrate 102 and driven by corresponding driving circuit 116. The cathode 108 is a common cathode for both OLEDs 202, 204. Similarly, each of the insulating layer 104, hole injection layer 110, and electron transport layer 114 is a common layer for both OLEDs 202, 204. However, each organic light emitting layer 112 needs to be individually patterned by evaporation techniques using shadow masks to fit the shape and size of each sub-pixel. In FIG. 3, a pixel 300 includes three OLEDs 302, 304, 306 formed on the same plane as sub-pixels, which emit lights of red, green, and blue from their corresponding organic light emitting layers 308, 310, 312, respectively. As noted above, the common anode 106 and common cathode 108 are formed for all the OLEDs 302, 304, 306, while the organic light emitting layers 308, 310, 312 are individually patterned for each sub-pixel.

Due to the process accuracy for patterning organic materials using shadow masks, the minimum size of each organic light emitting layer is limited. Moreover, as all the OLEDs are formed in the same plane in conventional devices as shown in FIGS. 1-3, sufficient spaces have to be maintained between adjacent sub-pixels to avoid overlapping of adjacent organic light emitting layers. Therefore, the resolution of the conventional OLED display devices is limited by the process accuracy of the organic light emitting layer and the planar structure of OLEDs.

Accordingly, there exists a need for improved display devices and method for making and driving the display devices to solve the above-mentioned problems.

SUMMARY

The present disclosure relates generally to display devices and methods for making and driving the display devices, and more particularly, to display devices having light emitting elements.

In one example, a device including an array of pixels for display is provided. Each of the pixels includes a first light emitting element and a second light emitting element. The first light emitting element is formed on a substrate. The second light emitting element is formed on the first light emitting element. The first and second light emitting elements share a same electrode.

In another example, a method for making a display device including an array of pixels is provided. For each of the pixels, a first light emitting element is formed on a substrate, and a second light emitting element is formed on the first light emitting element. The first and second light emitting elements share a same electrode.

In still another example, an apparatus including a display panel and control logic is provided. The display panel includes an array of pixels and driving circuit. Each of the pixels includes a first light emitting element formed on a substrate and a second light emitting element formed on the first light emitting element. The first and second light emitting elements share a same electrode. The driving circuit includes a main switch operatively connected to the first and second light emitting elements. The control logic is operatively connected the display panel and is configured to control the driving circuit such that the first and second light emitting elements alternatively emit light.

In yet another example, a method for driving a display panel including an array of pixels is provided. Each of the pixels includes a first light emitting element formed on a substrate and a second light emitting element formed on the first light emitting element. The first and second light emitting elements share a same electrode. A current is applied through the first light emitting element to cause the first light emitting element emit light in a first light emitting period. A current is applied through the second light emitting element to cause the second light emitting element emit light in a second light emitting period.

In yet another example, a device for driving a display panel including an array of pixels is provided. Each of the pixels includes a first light emitting element and a second light emitting element. The device includes a timing controller. The timing controller is configured to provide a first set of timing control signals for coordinating timing of gate scanning and timing of writing display data into the array of pixels. The timing controller is also configured to provide a second set of timing control signals for controlling timing of emitting light by the first and second light emitting elements of the array of pixels such that the first light emitting elements of the array of pixels emit light in a first light emitting period and the second light emitting elements of the array of pixels emit light in a second light emitting period, alternatively.

In yet another example, an integrated circuit for driving a display panel including an array of pixels is provided. Each of the pixels includes a first light emitting element and a second light emitting element. The integrated circuit includes a main switch and a plurality of auxiliary switches. The main switch is operatively connected to a first common cathode and a second common cathode of the array of pixels. Each of the plurality of auxiliary switches is operatively connected a shared anode of the first and second light emitting elements of each of the pixels. The integrated circuit is configured to alternatively apply a current through the first light emitting elements or the second light emitting elements of the array of pixels based on a control signal.

BRIEF DESCRIPTION OF THE DRAWINGS

The embodiments will be more readily understood in view of the following description when accompanied by the below figures and wherein like reference numerals represent like elements, wherein.

DETAILED DESCRIPTION

In the following detailed description, numerous specific details are set forth by way of examples in order to provide a thorough understanding of the relevant disclosures. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure.

The present disclosure provides an effective way to increase the resolution of display devices, thereby improving user experience. The present disclosure can reduce the size of each pixel by introducing a multi-light emitting elements stacked-up structure and a field sequential based driving method. Moreover, the present disclosure is completely compatible with the traditional process of OLED fabrication. Additional novel features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

Figure 4:
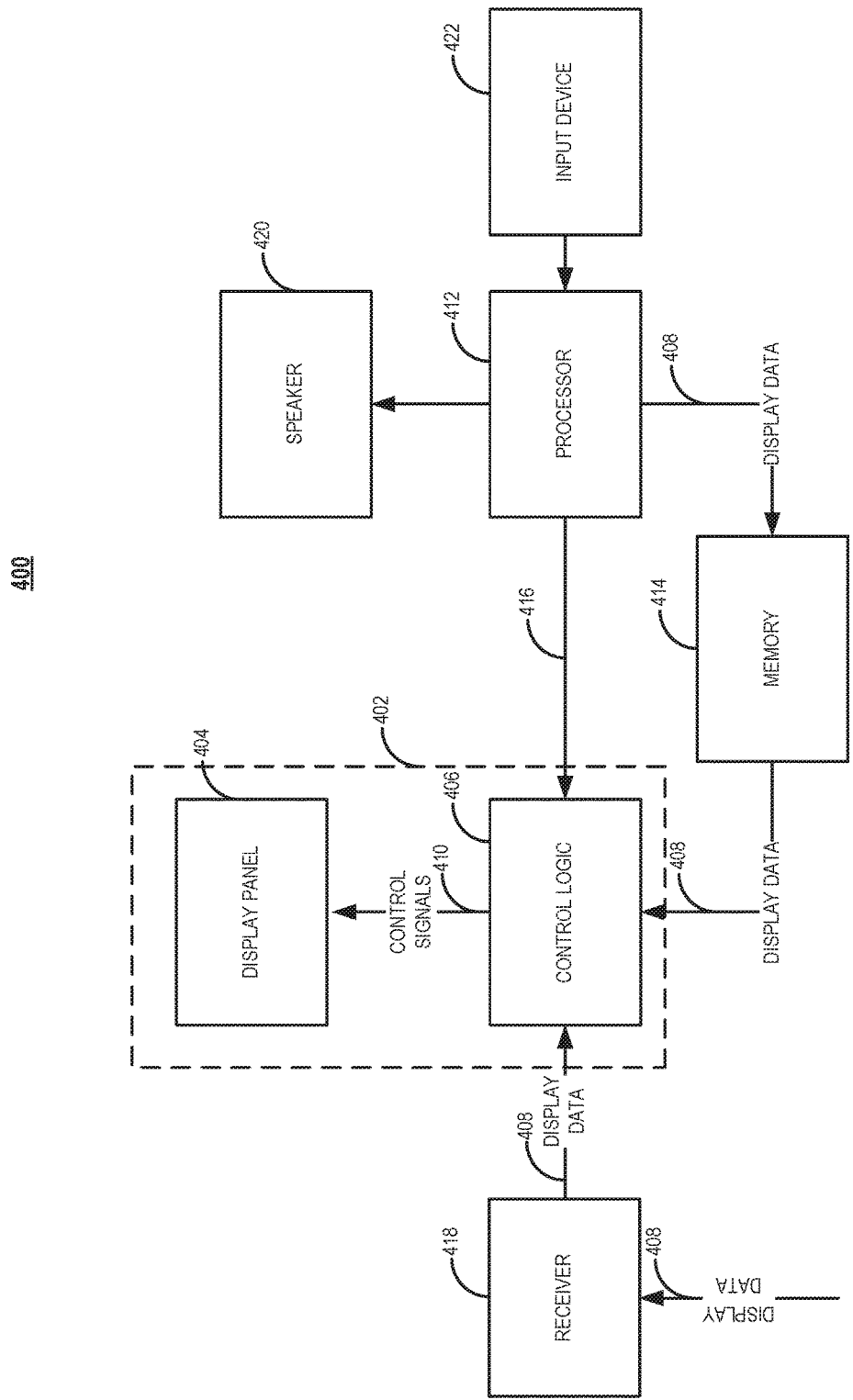
FIG. 4 is a block diagram illustrating a system including a display device in accordance with one embodiment set forth in the disclosure.

FIG. 4 illustrates a system 400 including a display device 402. The system 400 may be any suitable electronic device, for example, a television set, laptop computer, desktop computer, netbook computer, media center, handheld device (e.g., dumb or smart phone, tablet, etc.), global positioning system (GPS), electronic billboard, gaming console, set-top box, printer, or any other suitable electronic devices. In this example, the display device 402 is operatively coupled to other components of the system 400 and is part of the system 400, such as but not limited to, a television screen, computer monitor, dashboard, head-mounted display, or electronic billboard. The display device 402 may be an LED display, such as an OLED display, or any other suitable type of display device. The display device 402 may include a display panel 404 and control logic 406.

The display panel 404 has an array of pixels arranged in multiple rows and columns. Each of the pixels may include two or more sub-pixels, each of which is a light emitting element, such as an OLED, which can directly emit light without a backlight. In this example, a multi-OLEDs stacked-up structure is employed for each pixel to reduce the size of the pixel. For example, for each pixel, a first OLED is thinned on the substrate, and a second OLED is formed on the first OLED and shares the same anode with the first OLED. In other words, different from the conventional OLED display panel, in this example, the OLEDs of each pixel are not formed in the same plane.

The control logic 406 of the display device 402 may include a timing controller (TCON), a gate driving unit, a data driving unit, and any suitable hardware, software, firmware, or combination thereof, configured to receive display data 408 and provide control signals 410 to drive the display panel 404 based on the received display data 408. The control signals 410 are used for controlling writing of pixels and directing operations of the display panel 404. The control logic 406 may include any other suitable components, including, for example, digital-to-analog converters (DACs), latches, etc. In this example, the control signals 410 includes timing control signals for applying a field sequential based driving method in accordance with the multi-OLEDs stacked-up structure employed by the display panel 404.

In one example, the system 400 may be a laptop or desktop computer having a display device 402. In this example, the system 400 also includes a processor 412 and memory 414. The processor 412 may be, for example, a graphic processor (e.g., GPU), a general processor (e.g., APU, accelerated processing unit; GPGPU, general-purpose computing on GPU), or any other suitable processor. The memory 414 may be, for example, a discrete frame buffer or a unified memory. The processor 412 is configured to generate display data 408 in display frames and temporally store the display data 408 in the memory 414 before sending it to the control logic 406. The processor 412 may also generate other data, such as but not limited to, control instructions 416 or test signals, and provide them to the control logic 406 directly or through the memory 414. The control logic 406 then receives the display data 408 from the memory 414 or from the processor 412 directly.

In another example, the system 400 may be a television set having a display device 402. In this example, the system 400 also includes a receiver 418, such as but not limited to, an antenna, radio frequency receiver, digital signal tuner, digital display connectors, e.g., HDMI, DVI, DisplayPort, USB, Bluetooth, WiFi receiver, or Ethernet port. The receiver 418 is configured to receive display data 408 as an input of the system 400 and provide the native or modulated display data 408 to the control logic 406.

Figure 5:
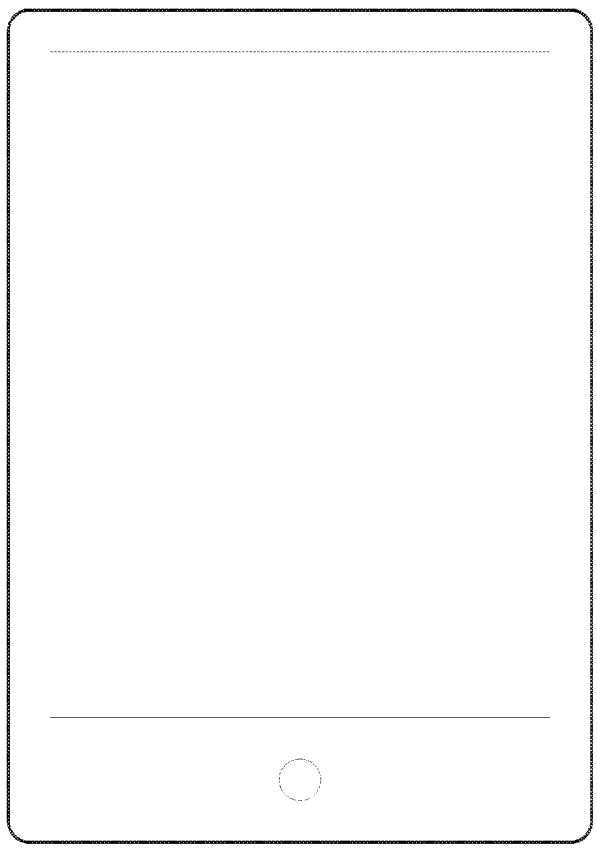
FIG. 5 is an illustration of one example of the system shown in FIG. 4 in accordance with one embodiment set forth in the disclosure.
Figure 6:
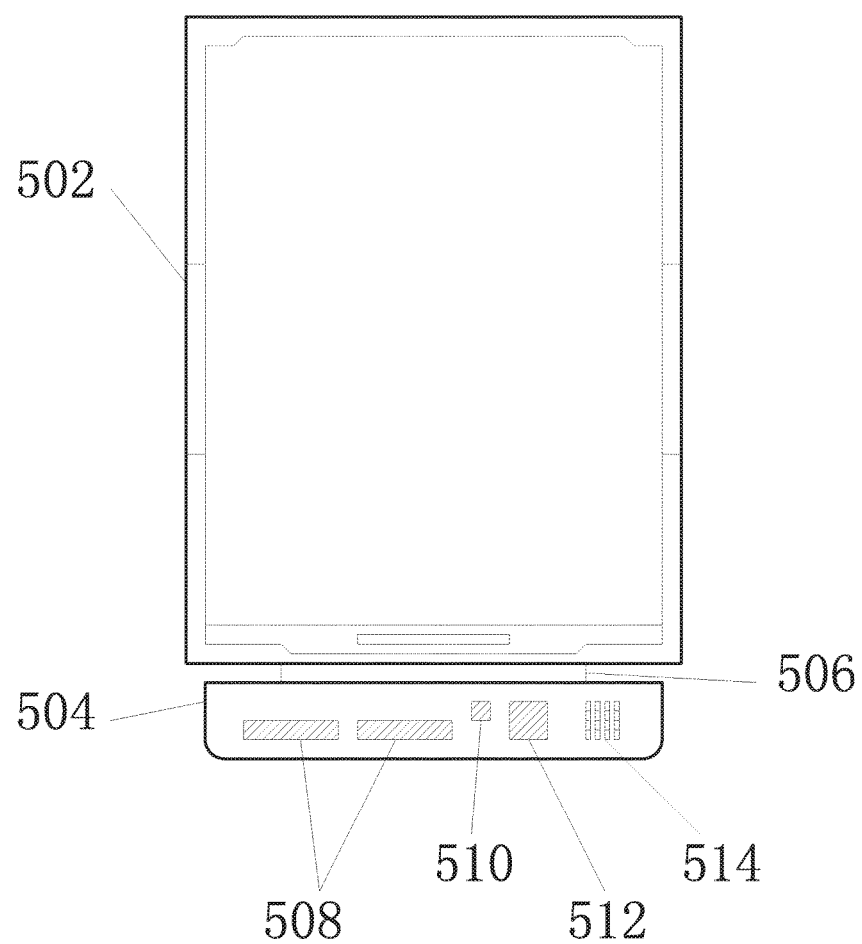
FIG. 6 is block diagram illustrating the system shown in FIG. 5 in accordance with one embodiment set forth in the disclosure.

In still another example, the system 400 may be a handheld device, such as a smart phone or a tablet. In this example, the system 400 includes the processor 412, memory 414, and receiver 418. The system 400 may both generate display data 408 by its processor 412 and receive display data 408 through its receiver 418. For example, the system 400 may be a tablet 500 as shown in FIGS. 5-6, which works as both a portable television and a portable computing device. In FIG. 6, the tablet 500 includes a display device 502 and a main control module 504 operatively connected to each other through a flexible printed circuit (FPC) 506. The main control module 504 includes, but is not limited to, one or more memory 508, a power management module 510, a CPU 512, and discrete components 514.

In any event, the system 400 at least includes the display device 402 with a multi-light emitting elements stacked-up structure and a field sequential based driving mechanism as described below in detail. The system 400 may also include any other suitable component such as, but not limited to, a speaker 420 and an input device 422, e.g., a mouse, keyboard, remote controller, handwriting device, camera, microphone, scanner, etc.

Figure 7:
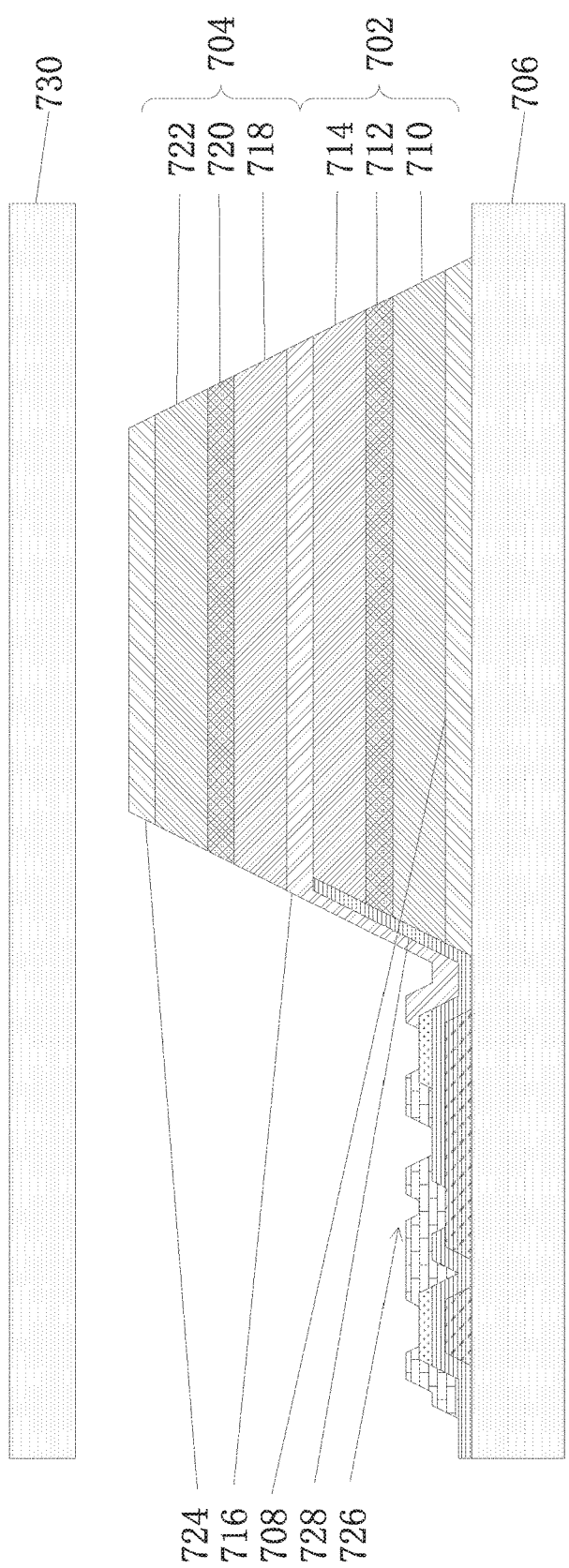
FIG. 7 is a side-view diagram illustrating two light emitting elements in a stacked-up structure in accordance with one embodiment set forth in the disclosure.

FIG. 7 is a side-view diagram illustrating two light emitting elements in a stacked-up structure in accordance with one embodiment set forth in the disclosure. In this example, the two light emitting elements are a first OLED 702 and a second OLED 704 formed in a stacked-up structure on a glass substrate 706. It is understood that, in addition to OLEDs, any other suitable light emitting elements that can directly emit light without a backlight may be employed in other examples.

Figure 1:
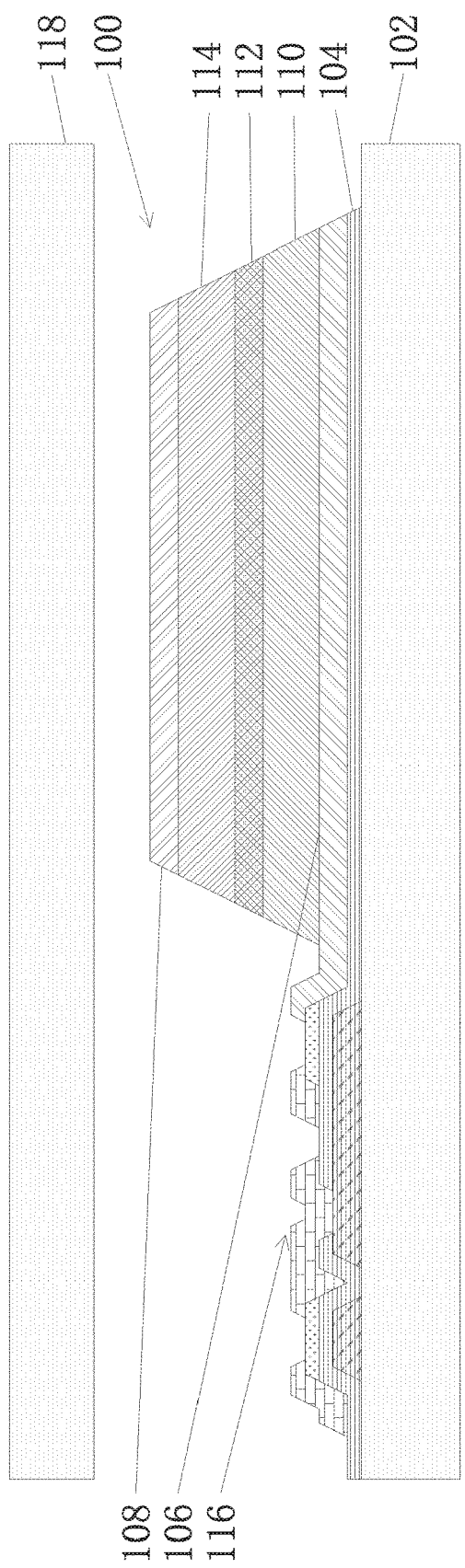
FIG. 1 is a side-view diagram illustrating a light emitting element in prior art.
Figure 2:
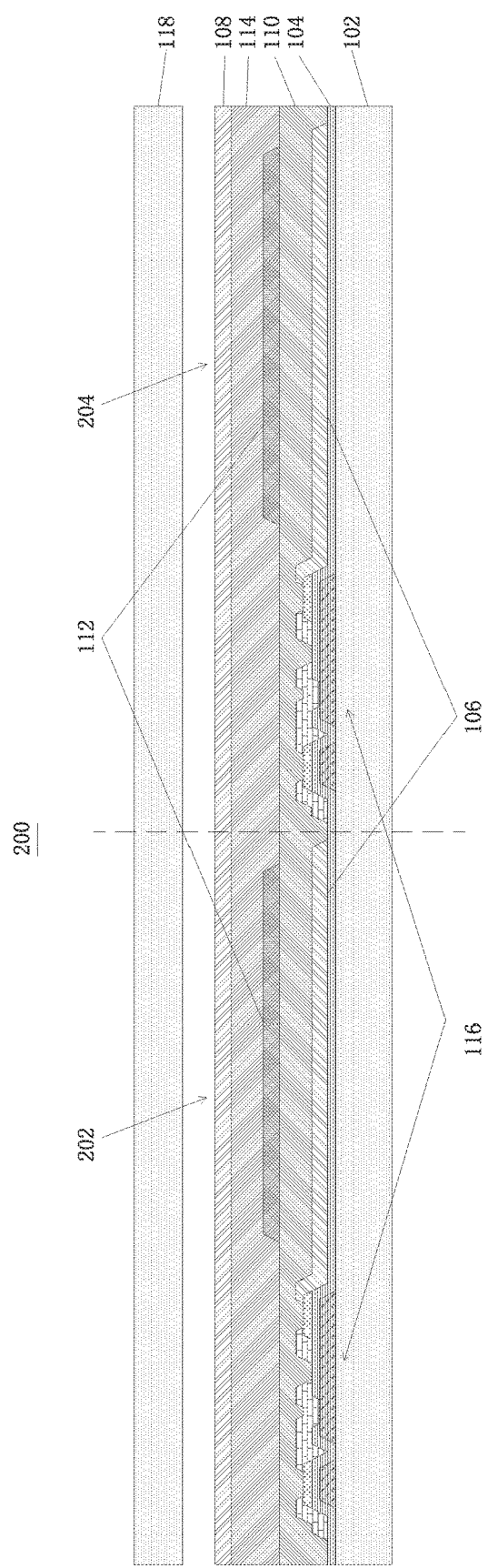
FIG. 2 is a side-view diagram illustrating a pixel including two light emitting elements in prior art.
Figure 3:
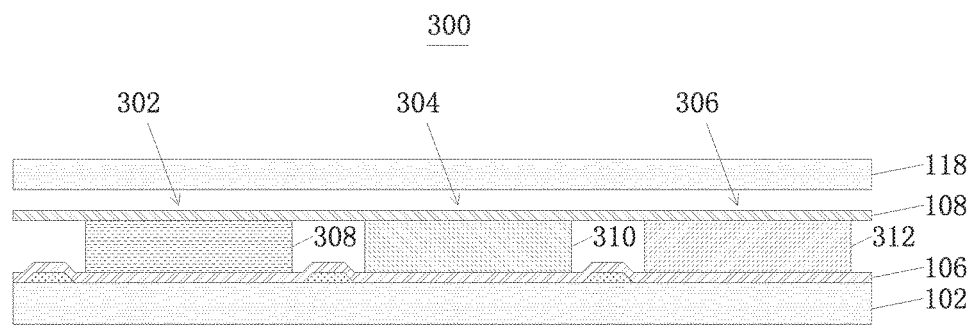
FIG. 3 is a side-view diagram illustrating a pixel including three sub-pixels of different colors in prior art.

In this example, the first OLED 702 may be an inverted OLED. In contrast to a conventional OLED in which the anode is placed on the substrate as illustrated in FIG. 1, an inverted OLED uses a bottom cathode. In this example, the first OLED 702 includes a first cathode 708 formed on the glass substrate 706 and a first electron transport layer 710 formed on the first cathode 708. For example, the first cathode 708 is made from aluminum using any suitable thin film metallization processes, such as evaporation and sputtering. The first OLED 702 also includes a first organic light emitting layer 712 formed on the first electron transport layer 710 and a first hole injection layer 714 formed on the first organic light emitting layer 712. Depending on the specific organic material used in the first organic light emitting layer 712, the first OLED 702 emits light at a certain wavelength (color) when a current is applied. The first electron transport layer 710, first organic light emitting layer 712, and first hole injection layer 714 may be made from any suitable materials known in the art for inverted OLEDs using any suitable thin film techniques, such as evaporation and molecular beam epitaxy (MBE). The first OLED 702 further includes an anode 716 formed on the first hole injection layer 714. The anode 716 may be made from a transparent conductive material, such as indium tin oxide (ITO) using thin film processes that do not damage organic layers, for example, evaporation or face target sputtering (FTS).

In this example, the second OLED 704 is formed on the first OLED 702 and shares the same anode 716 with the first OLED 702. That is, a conventional OLED and an inverted OLED are stacked one on top of another and share the same anode therebetween. The second OLED 704 includes the shared anode 716 and a second hole injection layer 718 formed on the shared anode 716. The second OLED 704 also includes a second organic light emitting layer 720 formed on the second hole injection layer 718 and a second electron transport layer 722 formed on the second organic light emitting layer 720. The second electron transport layer 722, second organic light emitting layer 720, and second hole injection layer 718 may be made from any suitable materials known in the art using any suitable thin film techniques, such as evaporation and MBE. In this example, the first and second organic light emitting layers 712, 720 are made from different organic materials and thus, emit light of different colors. The second OLED 704 further includes a second cathode 724 formed on the second electron transport layer 722. The second cathode 724 may be made from a transparent conductive material, such as ITO, using thin film processes that do not damage organic layers, for example, evaporation or FTS.

Any other suitable layers or components may be formed on the second OLED 704, such as a polarization layer or a touch screen sensing layer. In this example, glass encapsulation, including a cover glass 730, with humid absorbing getter is used for packaging the first and second OLEDs 702, 704.

In this example, driving circuit 726 is formed adjacent to the first and second OLEDs 702, 704. For example, the driving circuit 726 is made from LTPS on the glass substrate 706 before the first and second OLEDS 702, 704 are formed. An insulating layer 728 is then formed on the driving circuit 726. The insulating layer 728 may be made from, for example, silicon nitride or silicon dioxide. A via is reserved in the insulating layer 728 for the shared anode 716. During the process of forming the first OLED 702, the via is protected by a shadow mask until the anode 716 is formed. As shown in FIG. 7, the anode 716 extends and electrically connects to the driving circuit 726 through the via and is electrically insulated from the first cathode 708 by the insulating layer 728.

Figure 8:
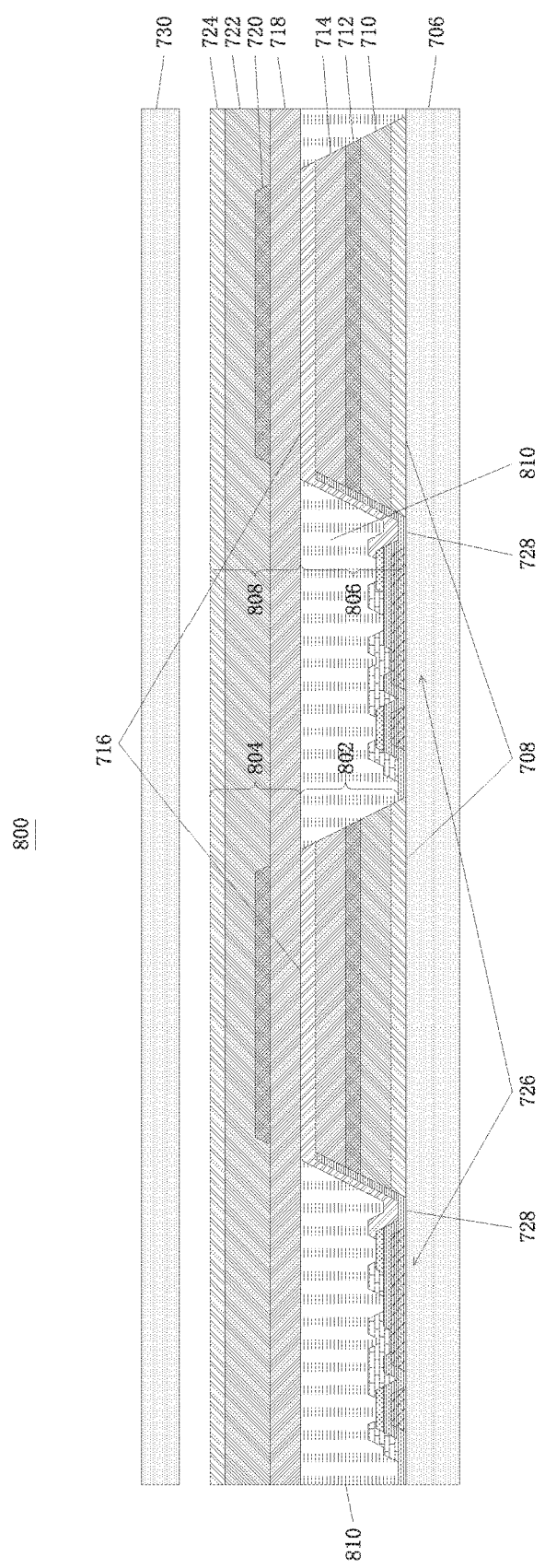
FIG. 8 is a side-view diagram illustrating a pixel including four light emitting elements in accordance with one embodiment set forth in the disclosure.

FIG. 8 is a side-view diagram illustrating a pixel including four light emitting elements in accordance with one embodiment set forth in the disclosure. In this example, the pixel 800 includes a first OLED 802, a second OLED 804, a third OLED 806, and a fourth OLED 808. The first and third OLEDs 802, 806 are inverted OLEDs. The first and third OLEDs 802, 806 formed on the glass substrate 706 and are disposed in substantially the same plane (bottom plane). The second and fourth OLEDs 804, 808 are conventional OLEDs and disposed in substantially the same plane (top plane). The second OLED 804 is formed on the first OLED 802 and shares the same anode with the first OLED 802; the fourth OLED 808 is formed on the third OLED 806 and shares the same anode with the third OLED 806.

OLEDs in the same plane have a common cathode. In this example, the first cathode 708 is a common cathode for the first and third OLEDs 802, 806 in the bottom plane, and the second cathode 724 is a common cathode for the second and fourth OLEDs 804, 808 in the top plane. Similarly, each of the second hole injection layer 718 and second electron transport layer 722 is a common layer for the second and fourth OLEDs 804, 808. In other words, conventional OLEDs in the top plane have a common hole injection layer, a common electron transport layer, and a common cathode.

Driving circuits 726 are first formed on the glass substrate 706 for corresponding OLEDs. In this example, each driving circuit 726 is configured to drive the two OLEDs that are stacked one on top of another and is electrically connected to the corresponding anode 716 shared by the two stacked-up OLEDs through a corresponding via in the insulating layer 728. After forming the driving circuit 726, the first and third OLEDs 802, 806 are formed on the glass substrate 706 using materials and processes suitable for inverted OLEDs as described above. Once the shared anodes 716 is formed, a planarization layer 810 is formed such that the second and fourth OLEDs 804, 808 can be formed on top of the first and third OLEDs 802, 806, respectively, using materials and processes suitable for conventional OLEDs as described above. It is understood that in other examples, more than two OLEDs may be stacked up in multiple planes, and OLEDs in the adjacent planes share the same anode.

Figure 9:
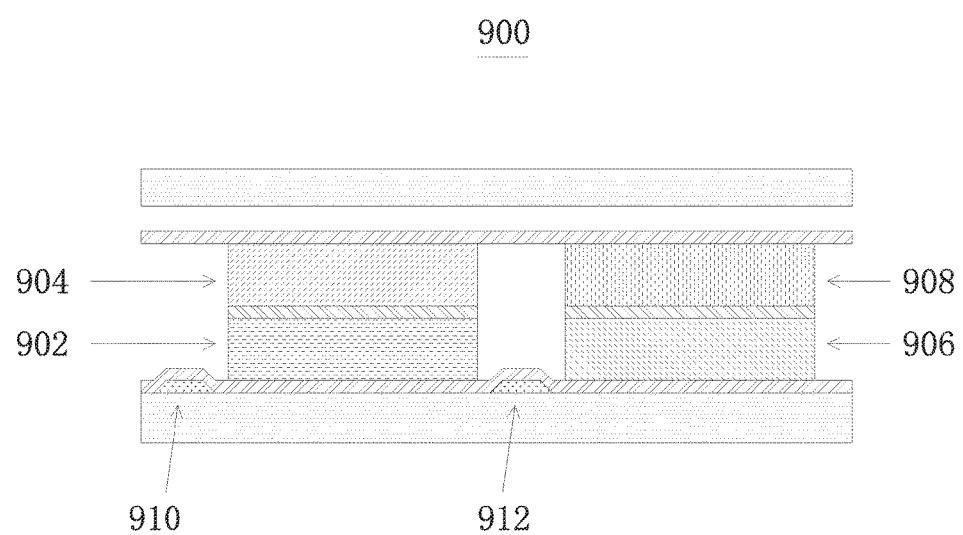
FIG. 9 is a side-view diagram illustrating a pixel including four sub-pixels of different colors in accordance with one embodiment set forth in the disclosure.

FIG. 9 is a side-view diagram illustrating a pixel including four sub-pixels of different colors in accordance with one embodiment set forth in the disclosure. Each of the pixels in the display device has the same sub-pixel arrangement. In this example, the pixel 900 includes a first OLED 902, a second OLED 904, a third OLED 906, and a fourth OLED 908 arranged in two planes. The first and third OLEDs 902, 906 are inverted OLEDs formed in the bottom plane, and the second and fourth OLEDs 904, 908 are conventional OLEDs formed in the top plane. The first and second OLEDs 902, 904 are driven by the driving circuit 910, and the third and fourth OLEDs 906, 908 are driven by the driving circuit 912.

In this example, the two OLEDs that are stacked one on top of another emit light of different colors. That is, the first and second OLEDs 902, 904 emit light of different colors, and the third and fourth OLEDs 906, 908 emit light of different colors. In one example, each of the OLEDs 902, 904, 906, 908 emits light of different colors. For example, the first OLED 902 emits red (R) light; the second OLED 904 emits blue (B) light; the third OLED 906 emits green (G) light; and the fourth OLED 908 emits white (W) light. It is understood that the color of light is not limited to R, G, B or W, and may include any other suitable colors, such as yellow (Y), cyan (C), or magenta (M). Any suitable sub-pixel arrangement may be employed by the configuration illustrated in FIG. 9 as long as the two OLEDs that are stacked one on top of another emit light of different colors. In this example, each of the OLEDs 902, 904, 906, 908 has substantially the same size in the plan view. It is understood that, in other examples, OLEDs of different sizes and/or shapes may be applied to the configuration illustrated in. FIG. 9.

Figure 10:
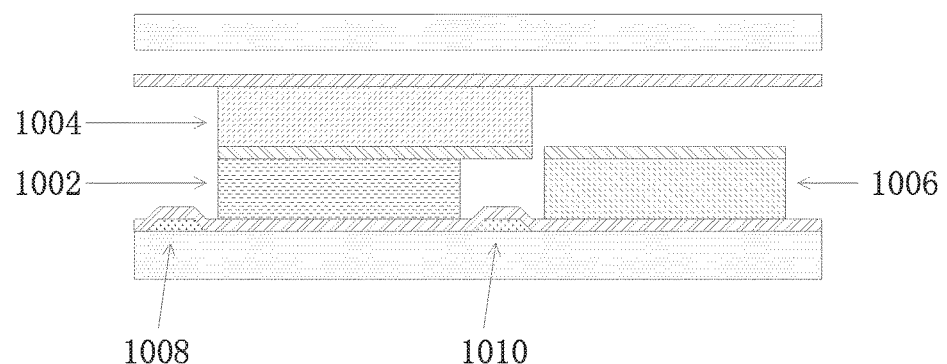
FIG. 10 is a side-view diagram illustrating a pixel including three sub-pixels of different colors in accordance with one embodiment set forth in the disclosure.

FIG. 10 is a side-view diagram illustrating a pixel including three sub-pixels of different colors in accordance with one embodiment set forth in the disclosure. Each of the pixels in the display device has the same sub-pixel arrangement. In this example, the pixel 1000 includes a first OLED 1002, a second OLED 1004, and a third OLED 1006 arranged in two planes. The first and third OLEDs 1002, 1006 are inverted OLEDs formed in the bottom plane, and the second OLED 1004 is a conventional OLED formed on the first OLED 1002 in the top plane. The first and second OLEDs 1002, 1004 are driven by the driving circuit 1008, and the third OLED 1006 is driven by the driving circuit 1010.

In this example, the two OLEDs that are stacked one on top of another emit light of different colors. That is, the first and second OLEDs 1002, 1004 emit light of different colors. In one example, each of the OLEDs 1002, 1004, 1006 emits light of different colors. For example, the first OLED 1002 emits red (R) light; the second OLED 1004 emits blue (B) light; and the third OLED 1006 emits green (G) light. It is understood that the color of light is not limited to R, G, or B, and may include any other suitable colors, such as yellow (Y), cyan (C), magenta (M), or white (W). Any suitable sub-pixel arrangement may be employed by the configuration illustrated in FIG. 10 as long as the two OLEDs that are stacked one on top of another emit light of different colors. In this example, the first and third OLEDs 1002, 1006 in the bottom plane have substantially the same size in the plan view, while the second OLED 1004 in the top plane has a size larger than that of the first OLED 1002 or the third OLED 1006. It is known that the luminous efficiency of blue (B) color is lower than that of red (R) or green (G) color. Thus, the B sub-pixel in the top plane is larger than the R and G sub-pixels in the bottom plane to compensate for its deficiency of luminous efficiency.

The size of each pixel in the conventional OLED display cannot be further reduced due to the spaces between adjacent sub-pixels. Specifically, for a pixel including three sub-pixels arranged in the same plane, the pixel includes three spaces between adjacent sub-pixels, which cannot be further reduced. In the examples shown in FIGS. 7-10, as each plane includes only two OLEDS, the waste of area due to the spaces between adjacent sub-pixels is reduced. In the examples shown in FIGS. 7-10, a full pixel having three or more sub-pixels can be made in the width of two sub-pixels. Taking the change in the depth direction into consideration, the area of each pixel in the examples shown in FIGS. 7-10 can be reduced to 4/9 of the area of each pixel in the conventional OLED display, thereby increasing the display resolution.

Figure 11:
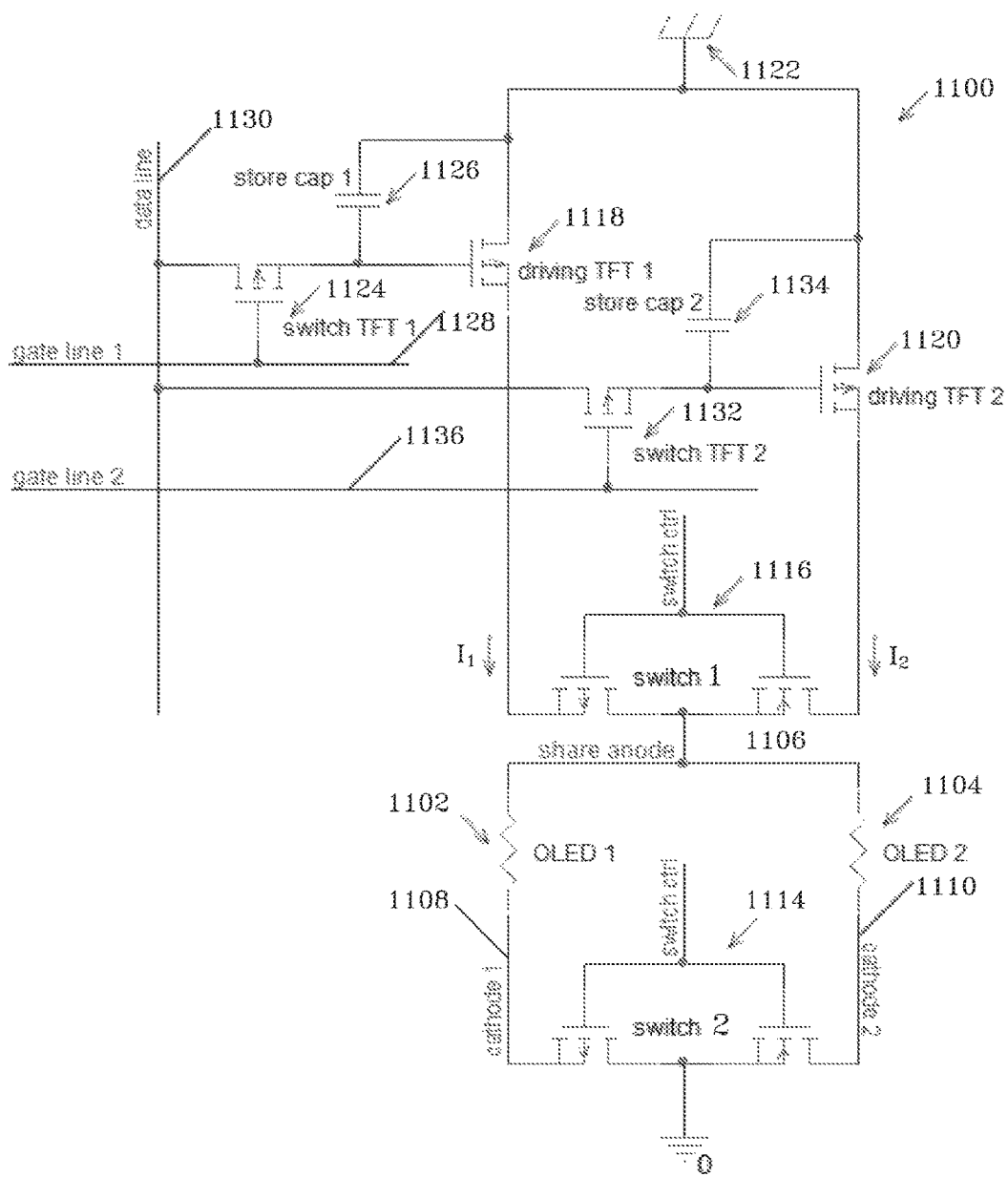
FIG. 11 is a circuit diagram illustrating driving circuit of the display device shown in FIG. 4 in accordance with one embodiment set forth in the disclosure.

FIG. 11 is a circuit diagram illustrating driving circuit of the display device in accordance with one embodiment set forth in the disclosure. As noted above, the driving circuit 1100 may be an integrated circuit formed in a LTPS layer on the glass substrate on which a first OLED (OLED1) 1102 and a second OLED (OLED2) are formed in a stacked-up structure. In this example, the driving circuit 1100 is configured to alternatively apply a current through the first OLED 1102 or the second OLED 1104 based on a control signal (switch ctrl). Specifically, the driving circuit 1100 is configured to apply a first current ($I_1$) through the first OLED 1102 to cause the first OLED 1102 emit light in a first light emitting period, and apply a second current ($I_2$) through the second OLED 1104 to cause the second OLED 1104 emit light in a second light emitting period.

In this example, the first and second OLEDs 1102, 1104 share the same anode 1106 and include a first cathode 1108 and a second cathode 1110, respectively. As noted above, the first cathode 1108 is part of a first common cathode of the array of pixels, and the second cathode 1110 is part of a second common cathode of the array of pixels. The driving circuit 1100 includes a main switch (switch 1) 1114 and an auxiliary switch (switch 2) 1116. In this example, the main switch 1114 is a CMOS switch having two transistors operatively connected to the first and second cathodes 1108, 1110, respectively, and the ground. The gate of the transistors is controlled by the control signal. As the first and second cathodes 1108, 1110 of each OLED 1102, 1104 is part of a common cathode of all the pixels in the array, one main switch 1114 is provided for all the pixels. In this example, the auxiliary switch 1116 is a CMOS switch having two transistors operatively connected to a first driving transistor (driving TFT 1) 1118 and a second driving transistor (driving TFT 2) 1120, respectively, and the shared anode 1106. The gate of the transistors of the auxiliary switch 1116 is controlled by the same control signal that controls the main switch 1114. As every two OLEDs 1102, 1104 that are stacked one on top of another share the same anode 1106, one auxiliary switch 1116 is provided for every two OLEDs 1102, 1104 in this example.

In response to the control signal, the main switch 1114 couples to one of the first and second cathodes 1108, 1110 to form current paths between the corresponding first or second cathodes 1108, 1110 and the shared anodes 1106 of the array of pixels. Meanwhile, in response to the same control signal, the auxiliary switch 1116 couples to one of the first and second driving transistors 1118, 1120 to apply the corresponding current. For example, in the first light emitting period, the control signal causes the first current ($I_1$) generated by the first driving transistor 1118 to be applied to the shared anode 1106 and also causes the first current ($I_1$) to pass through the first OLED 1102. In other words, in the first light emitting period, a current path, including the voltage/current source 1122, the first driving transistor 1118, the shared anode 1106, the first OLED 1102, the first cathode 1108, and the ground, is formed. In the second light emitting period, the control signal causes the second current ($I_2$) generated by the second driving transistor 1120 to be applied to the shared anode 1106 and also causes the second current ($I_2$) to pass through the second OLED 1104. In other words, in the second light emitting period, a current path, including the voltage/current source 1122, the second driving transistor 1120, the shared anode 1106, the second OLED 1104, the second cathode 1110, and the ground, is formed.

In this example, the driving circuit 1100 further includes a first switching transistor (switch TFT 1) 1124 and a first capacitor (store cap 1) 1126 operatively connected to a first gate line 1128 and a data line 1130. When the first gate line 1128 is charged (i.e., a voltage signal is applied through the first gate line 1128), the first switching transistor 1124 is turned on, and a first piece of display data is stored in the first capacitor 1126 through the data line 1130. The first capacitor 1126 is coupled to the gate and source of the first driving transistor 1118. As the first driving transistor 1118 works in the linear region, the first current ($I_1$) generated by the first driving transistor 1118 is determined based on the potential of the first capacitor 1126, i.e., the first piece of display data.

Similarly, the driving circuit 1100 also includes a second switching transistor (switch TFT 2) 1132 and a second capacitor (store cap 2) 1134 operatively connected to a second gate line 1136 and the same data line 1130. When the second gate line 1136 is charged (i.e., a voltage signal is applied through the second gate line 1136), the second switching transistor 1132 is turned on, and a second piece of display data is stored in the second capacitor 1134 through the data line 1130. The second capacitor 1134 is coupled to the gate and source of the second driving transistor 1120. As the second driving transistor 1120 works in the linear region, the second current ($I_2$) generated by the second driving transistor 1120 is determined based on the potential of the second capacitor 1134, i.e., the second piece of display data. In this example, two gate lines are provided for the two stacked-up OLEDs, respectively, and each of the gate lines is separately charged in the light emitting period of the corresponding OLED. On the other hand, one data line is provided for the two stacked-up OLEDs, and the display data for the two OLEDs is stored in the corresponding capacitor through the same data line in different periods. In other words, display data is transmitted to different capacitors through the same data line using time division multiplexing (TDM).

Figure 12:
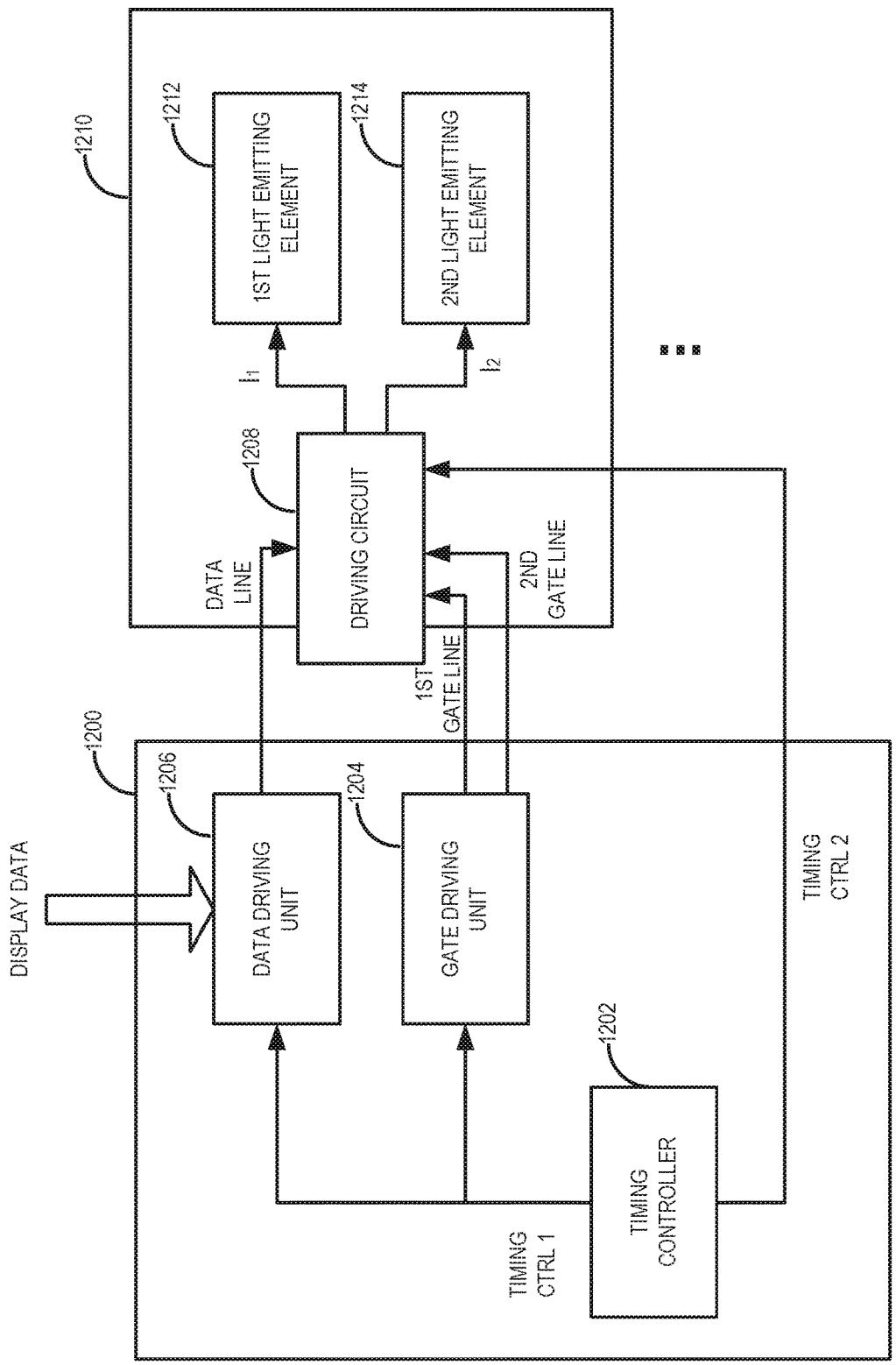
FIG. 12 is block diagram illustrating control logic of the display device shown in FIG. 4 in accordance with one embodiment set forth in the disclosure.

FIG. 12 is block diagram illustrating control logic of the display device in accordance with one embodiment set forth in the disclosure. In this example, the control logic 1200 includes a timing controller 1202, a gate driving unit 1204, and a data driving unit 1206. The control logic 1200 is operatively coupled to a display panel and configured to control the driving circuit 1208 to drive each pixel 1210 of the display panel. In this example, each pixel 1210 includes at least a first light emitting element 1212 and a second light emitting element 1214 formed in a stacked-up structure as described above. The first and second light emitting elements 1212, 1214 may be OLEDs. In this example, a first current ($I_1$) and a second current ($I_2$) are alternatively applied through the first and second light emitting elements 1212, 1214 by the driving circuit 1208 under the control of the control logic 1200 such that the first and second light emitting elements 1212, 1214 alternatively emit light in different light emitting periods.

In this example, the gate driving unit 1204 is configured to, for each pixel 1210, respectively scan the first light emitting element 1212 through a first gate line and the second light emitting element 1214 through a second gate line. It is understood that all the pixels in the same row have at least a common gate line such that all the pixels in the same row are scanned at the same time. In this example, all the pixels in the same row have two common gate lines. One of the common gate lines is used for scanning all the first light emitting elements in the same pixel row (light emitting elements in the bottom plane), and the other common gate line is used for scanning all the second light emitting elements in the same row of pixels (light emitting elements in the top plane). In this example, only after the light emitting elements in both planes of one row of pixels have been scanned, the gate driving unit 1204 then scans the next row of pixels. In other words, the scanning order may be represented as 1a, 1b, 2a, 2b, 3a, 3b, . . . Na, Nb (assuming the display panel includes N rows of pixels and each row of pixels has a first gate line a and a second gate line b). It is understood that in other examples, the scanning order may be different, such as 1a, 2a, 3a, . . . Na, 1b, 2b, 3b, . . . Nb.

In this example, the data driving unit 1206 is configured to, for each pixel 1210, respectively write, through the same data line, a first piece of display data into the first light emitting element 1212 and a second piece of display data into the second light emitting element 1214. The display data is received in successive frames at a frame rate, such as 30, 60, or 72 Hz. As noted above, for each pixel 1210, display data for different light emitting elements 1212, 1214 are written through the same data line in different time periods using TDM.

In this example, the timing controller 1202 is configured to provide a first set of timing control signals (timing ctrl 1) to the gate driving unit 1204 and data driving unit 1206. The first set of timing control signals coordinate timing of gate scanning and timing of writing display data. In this example, the gate scan pulse for each gate line of all the rows of pixels (e.g., 1a, 1b, 2a, 2b, . . . ) is synchronized with the display data voltage. The timing controller 1202 is also configured to provide a second set of timing control signals (timing ctrl 2) to the driving circuit 1208 to control the operations of the main switch and each of the auxiliary switches for the corresponding pixel 1210. The second set of timing control signals include the control signal (switch ctrl) shown in FIG. 11. Specifically, the second set of timing control signals control timing of emitting light by the first and second light emitting elements 1212, 1214 of the array of pixels such that the first light emitting elements 1212 of the array of pixels emit light in a first light emitting period and the second light emitting elements 1214 of the array of pixels emit light in a second light emitting period, alternatively. Although only one pixel 1210 is depicted in FIG. 12, it is understood that, as the second set of timing control signals are provided to all the pixels simultaneously, all the first light emitting elements (light emitting elements in the bottom plane) emit light simultaneously in each first light emitting period, and all the second light emitting elements (light emitting elements in the top plane) emit light simultaneously in each second light emitting period. The timing of emitting light and timing of gate scanning are described below in detail.

Figure 13:
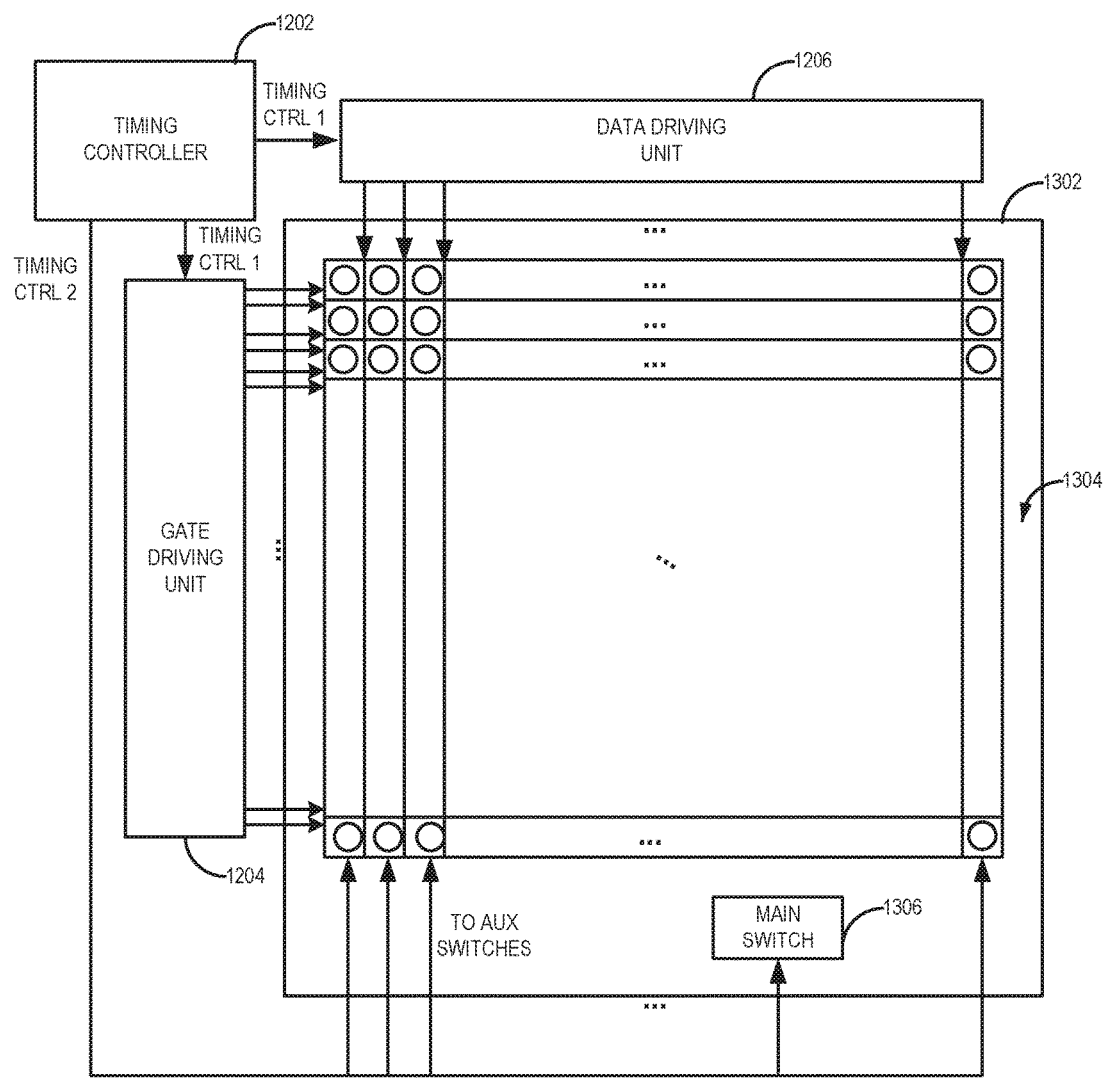
FIG. 13 is a block diagram illustrating the display device shown in FIG. 4 in accordance with one embodiment set forth in the disclosure.

FIG. 13 is a block diagram illustrating one example of the display device shown in FIG. 4 in accordance with one embodiment set forth in the disclosure. In this example, the display device 402 includes a display panel 1302, the timing controller 1202, a gate driving unit 1204, and data driving unit 1206. The display panel 1302 includes an array of pixels 1304, each of which includes at least two light emitting elements in the stacked-up structure as described above, and driving circuit having a main switch 1306 and a plurality of auxiliary switches for each of the pixels 1304.

The gate driving unit 1204 is configured to apply, through the gate line, a gate scan voltage to the gate of each switching transistor to turn on the corresponding switching transistor so that display data for the corresponding light emitting element (sub-pixel) may be written by the data driving unit 1206. The gate driving unit 1204 may include one or more DACs and multiplexers (MUX) for converting digital control signal received from the timing controller 1202 to analog gate scan voltages and applying the gate scan voltages to the gate lines of each row of pixels according to the preset scanning sequences. The data driving unit 1206 may include one or more DACs, MUXs, and arithmetic circuit for controlling timing of application of voltage to the source of each switching transistor through the data lines and a magnitude of the applied voltage according to gradations of display data based on the digital control signal received from the timing controller 1202.

In this example, to display a row of pixels, the display data for the row of pixels is received by the timing controller 1202. The timing controller 1202 then provides the first set of timing control signals to the gate driving unit 1204 and data driving unit 1206. The first set of timing control signals coordinate timing of gate scanning and timing of writing display data. In response to the first set of timing control signals, the gate driving unit 1204 scans the corresponding row of pixels through the two gate lines thereof, and the data driving unit 1206 writes the received display data to each of the pixels in the row simultaneously through their corresponding data lines. As noted above, for each pixel, the first set of timing control signals from the timing controller 1202 also ensure that the two pieces of display data for the two stacked-up light emitting elements are written through the same data line in different periods using TDM. The same process may be repeated for each row of pixels until the display data in a frame is written into the array of pixels 1304. Although one gate driving unit 1204 is shown in FIG. 13, it is understood that two or more gate driving units may be employed in other examples to simultaneously scan the first and second light emitting elements of each pixel through the two gate lines thereof.

In this example, the timing controller 1202 also provides the second set of timing control signals to the main switch 1306 and each of the auxiliary switches. The second set of timing control signals control timing of emitting light by the first and second light emitting elements of the array of pixels 1304 such that the first light emitting elements of the array of pixels 1304 emit light in each first light emitting period and the second light emitting elements of the array of pixels 1304 emit light in each second light emitting period, alternatively. In this example, the lengths of the first and second light emitting periods are substantially the same. That is, the same control signal is provided to the main switch 1306 and the auxiliary switch for each of the array of pixels 1304 such that all the first and second light emitting elements (e.g., light emitting elements in the bottom and top planes) of the array of pixels 1304 are alternately activated in a field sequential manner.

Figure 14:
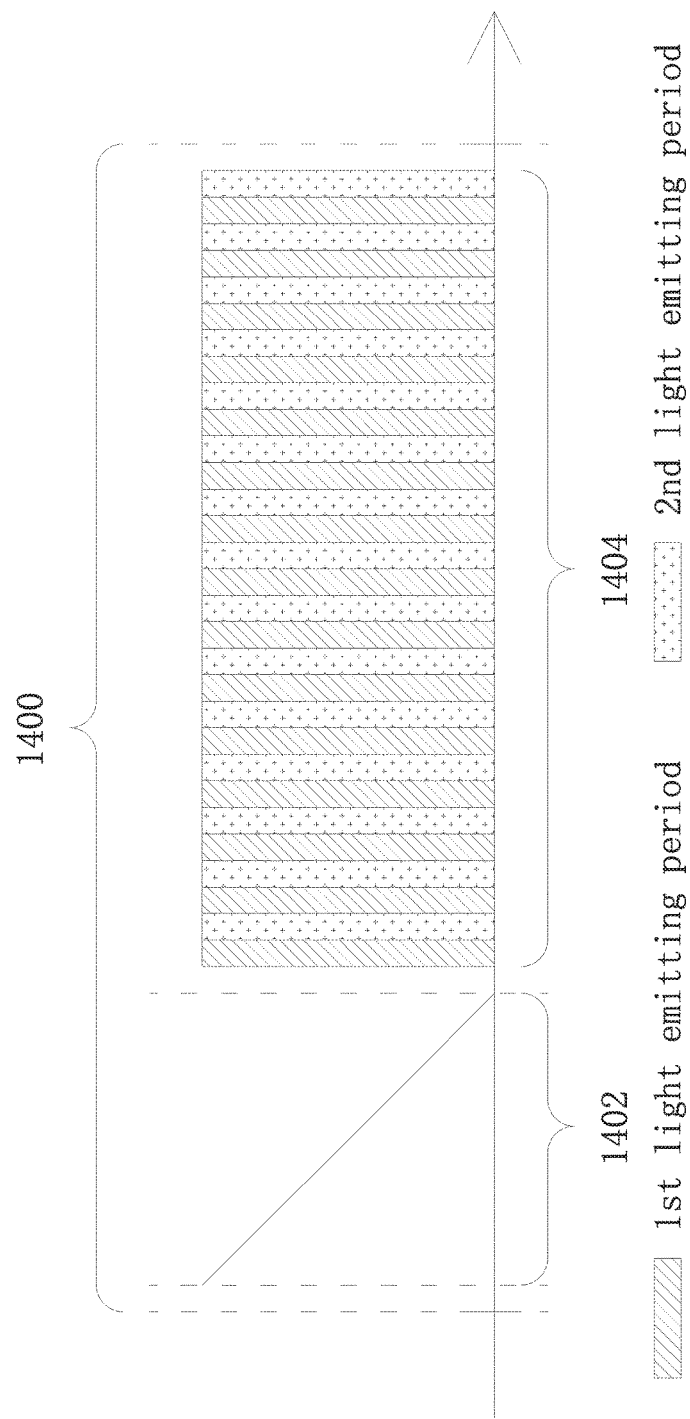
FIG. 14 is a timing diagram illustrating a method for driving the display device shown in FIG. 4 in accordance with one embodiment set forth in the disclosure.

FIG. 14 is a timing diagram illustrating a method for driving the display device in accordance with one embodiment set forth in the disclosure. In this example, in each frame period 1400, the first and second light emitting elements of the array of pixels alternatively emit light after the display data has been written into the array of pixels. In other words, each frame period 1400 is separated into a gate scanning/data writing period 1402 and a light emitting period 1404 such that the display data is not updated when the light emitting elements are flashing. The length of the gate scanning/data writing period 1402 may be determined based on the refresh rate of the display device and the number of rows of pixels (horizontal display resolution) and controlled by the gate and data driving units in response to the first set of timing control signals. In this example, the lengths of the first and second light emitting periods are substantially the same, and the frequency of emitting light (flashing) is controlled by the main switch and corresponding auxiliary switch in response to the second set of timing control signals. The minimum length of the first or second light emitting period, i.e., the highest frequency of emitting light is limited by the instinct capacitance of the first and second common cathodes that are connected to the main switch. In this example, the main switch acts as a three-way switch, which turns off both the first and second light emitting elements in the gate scanning/data writing period 1402 and alternatively turns on the first light emitting element and second light emitting element in the light emitting period 1404.

Figure 15:
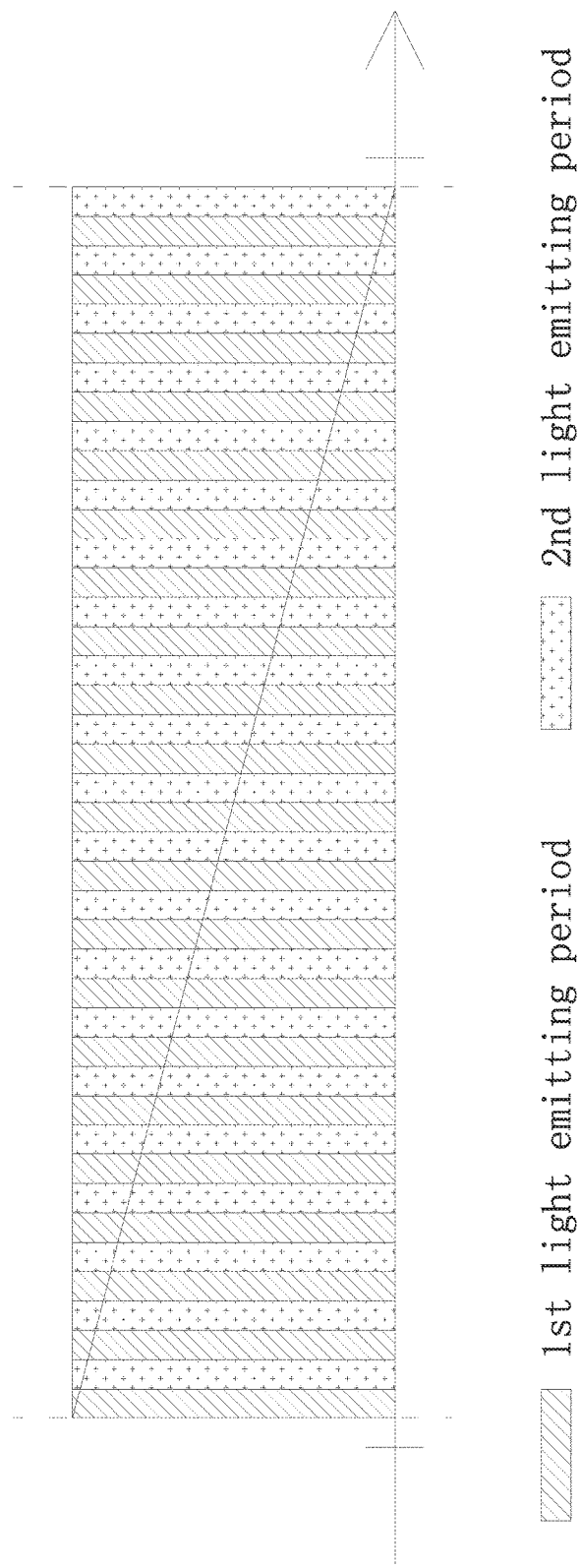
FIGS. 15-17 are timing diagrams illustrating another method for driving the display device shown in FIG. 4 in accordance with different embodiments set forth in the disclosure.
Figure 16:
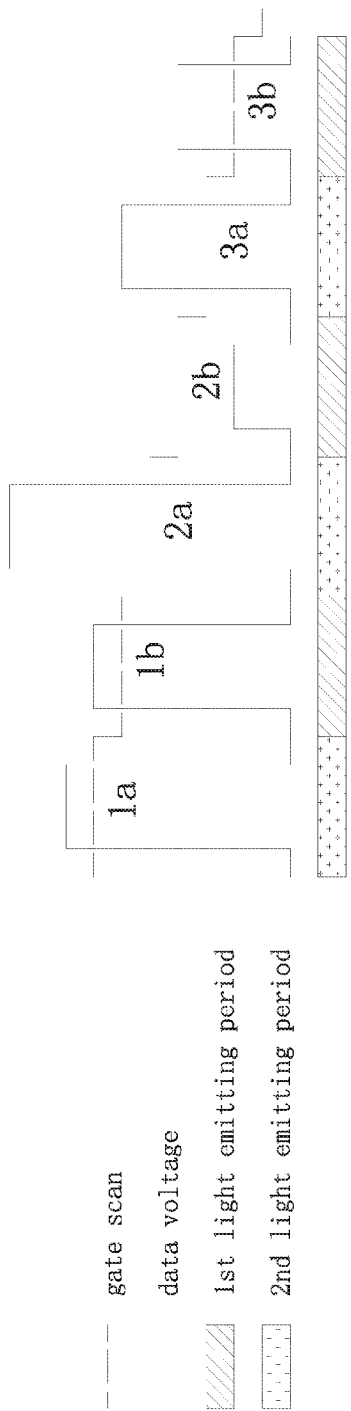
Figure 17:
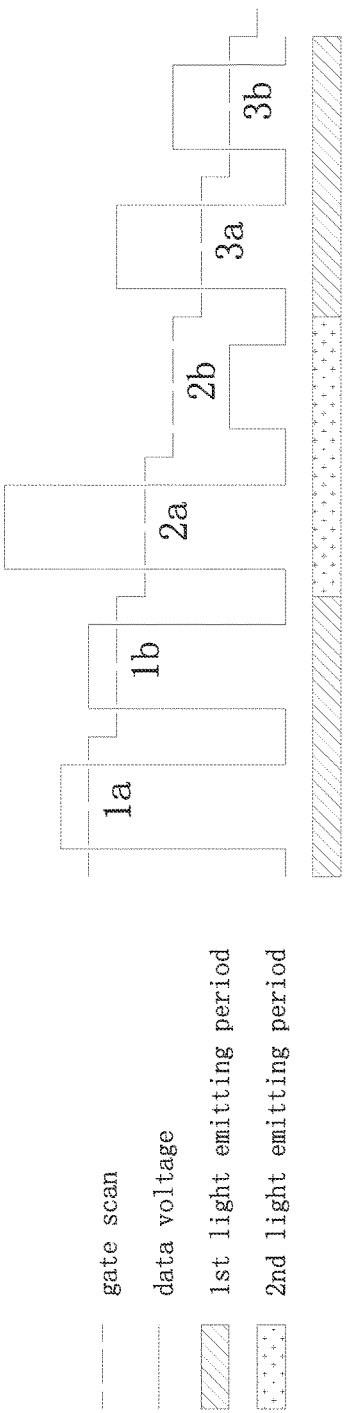

FIGS. 15-17 are timing diagrams illustrating another method for driving the display device in accordance with different embodiments set forth in the disclosure. In this example, as shown in FIG. 15, the gate scanning/data writing period and light emitting period are merged in each frame period, and the timing of emitting light is synchronized with the timing of gate scanning. The synchronization is controlled by the control logic through the first and second sets of timing control signals. In this example, the main switch acts as a two-way switch, which alternatively turns on the first light emitting element and second light emitting element.

In one example as shown in FIG. 16, the frequency of gate scanning is substantially the same as the frequency of emitting light. Assuming the first light emitting elements (sub-pixels) of each pixel emit light in the first light emitting periods, and the second light emitting elements (sub-pixels) of each pixel emit light in the second light emitting periods, in this example, the first light emitting elements are scanned and the display data for the first light emitting elements are written in the second light emitting periods in which the second light emitting elements emit light, and the second light emitting elements are scanned and the display data for the second light emitting elements are written in the first light emitting periods in which the first light emitting elements emit light. As shown in FIG. 16, when the first gate lines of each pixel are being charged (e.g., 1a, 2a, 3a), the second sub-pixels emit light and the first sub-pixel do not emit light, such that changing of the display data (data voltage) for the first sub-pixels does not cause any visual change. Similarly, when the second gate lines of each pixel are being charged (e.g., 1b, 2b, 3b), the first sub-pixels emit light and the second sub-pixel do not emit light to avoid any visual change caused by updating of the display data (data voltage) for the second sub-pixels. Accordingly, the timings of emitting light and gate scanning are synchronized by the first and second sets of timing control signals such that the display data for each light emitting element (sub-pixel) is not updated when the corresponding light emitting element is emitting light.

In another example as shown in FIG. 17, the frequency of gate scanning is twice of the frequency of emitting light. In this example, in each extended light emitting period, two gate lines of the same row of pixels are charged. Thus, the display data (data voltage) for each sub-pixel changes when the corresponding, sub-pixel emits light in the extended light emitting period. In this example, the length of each extended light emitting period is determined based on the instinct capacitance of the first and second common cathodes. For example, assuming the refresh rate of display is 60 Hz and the horizontal display resolution is 1920 (in each frame period, there are 1920×2 gate lines need to be scanned), the gate scan pulse width is 4.34 µs, which is also the length of each light emitting period if the frequency of gate scanning is the same as the frequency of emitting light as described before with respect to FIG. 16. However, if the instinct capacitance of the first and second common cathodes is large enough, the delay of switching between the first and second light emitting elements may be larger than the gate scan pulse width (e.g., the delay is 6 µs, while the gate scan pulse width is 4.34 µs). In that case, the frequency of emitting light has to be reduced to compensate for the delay of switching caused by the instinct capacitance of the first and second common cathodes. In the example of FIG. 17, the frequency of gate scanning is twice of the frequency of emitting light. In other examples, the frequency of gate scanning may be n times of the frequency of emitting light, where n is a positive integer and is determined based on the instinct capacitance of the first and second common cathodes as noted above.

Figure 18:
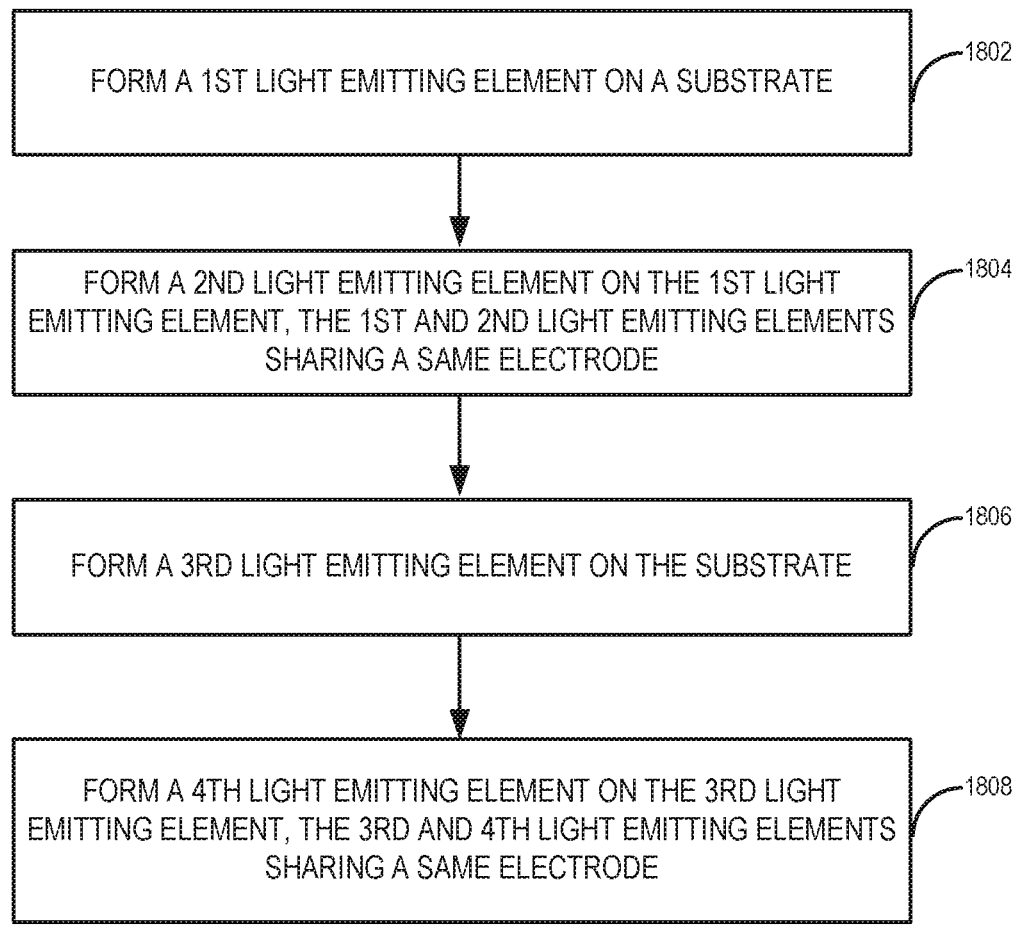
FIGS. 18, 19A, and 19B are flow charts illustrating a method for making the display device shown in FIG. 4 in accordance with different embodiments set forth in the disclosure.
Figure 19A:
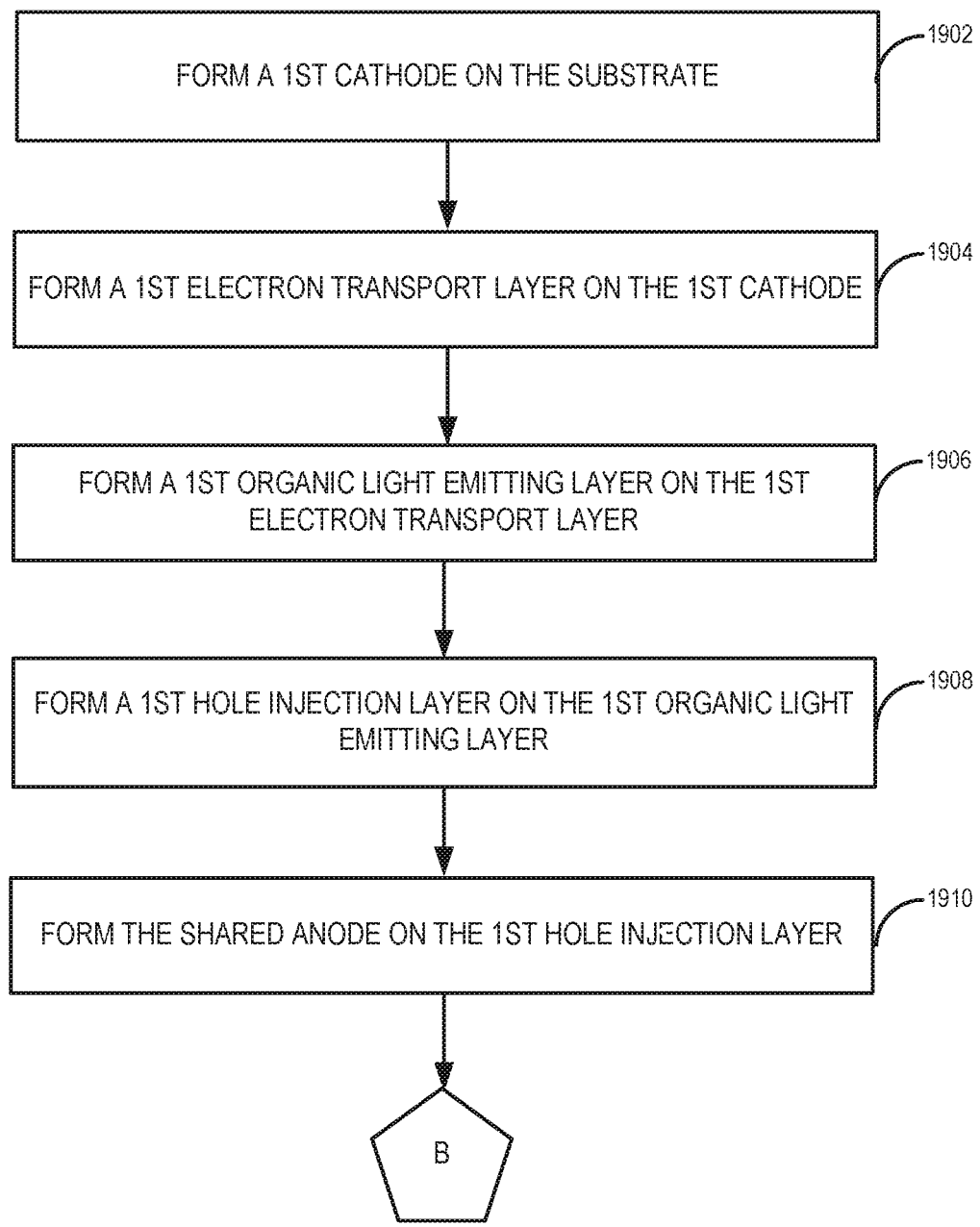
Figure 19B:
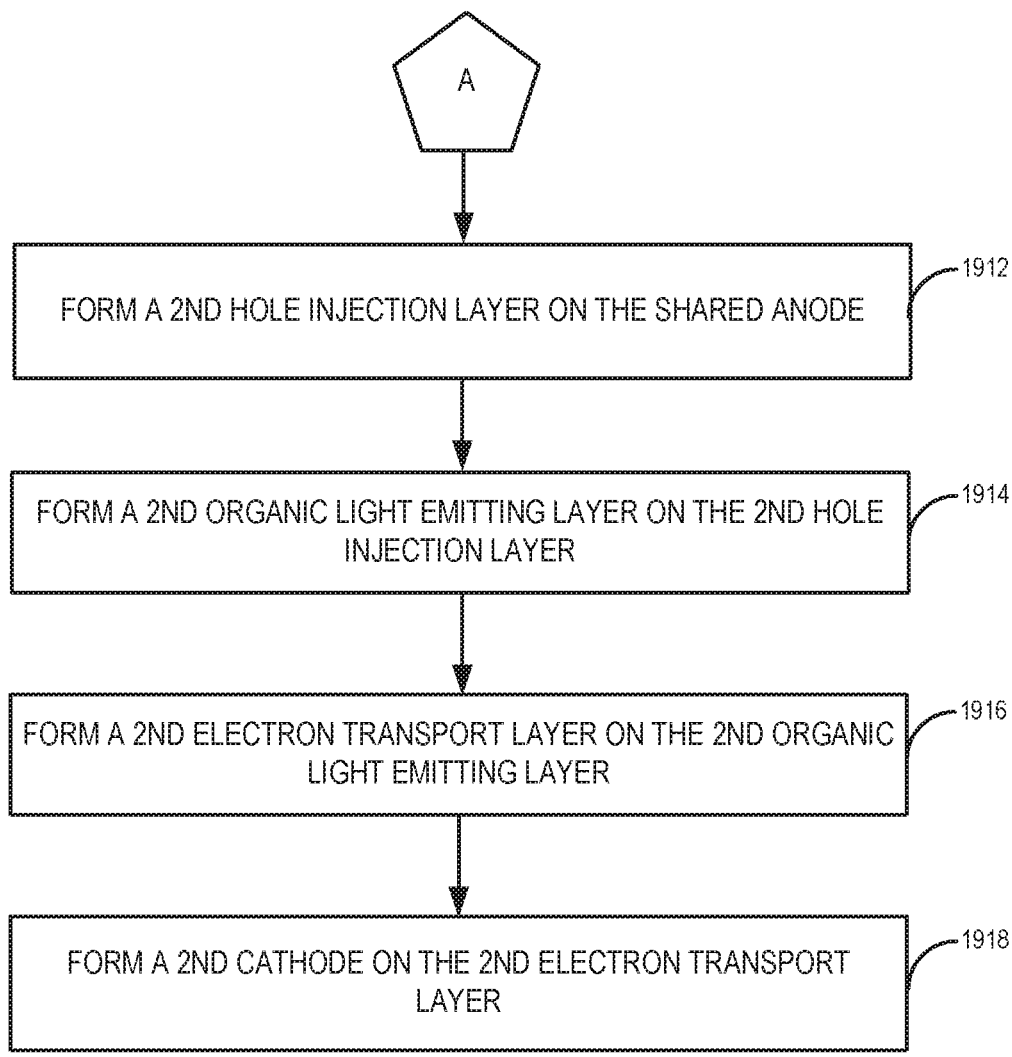

FIGS. 18, 19A, and 19B are flow charts illustrating a method for making the display device in accordance with different embodiments set forth in the disclosure. It will be described with reference to the above figures. However, any suitable logic, units, or circuits may be employed. In FIG. 18, beginning at block 1802, for each of the pixels, a first light emitting element is formed on a substrate. For example, an inverted OLED is formed on a glass substrate. At block 1804, for each of the pixels, a second light emitting element is formed on the first light emitting element. The first and second light emitting elements share a same electrode. For example, a conventional OLED is formed on the inverted OLED and shares the same anode with the inverted OLED. Additionally or optionally, at block 1806, for each of the pixels, a third light emitting element is formed on the substrate. For example, another inverted OLED is formed on the glass substrate. Proceeding to block 1808, for each of the pixels, a fourth light emitting element is formed on the third light emitting element. The third and fourth light emitting elements share a same electrode. For example, another conventional OLED is formed on the second inverted OLED and shares the same anode with the second inverted OLED.

Referring now to FIG. 19, beginning at block 1902, a first cathode is formed on the substrate. The first cathode of the first light emitting element may be part of a first common cathode of the array of pixels. The first cathode may be made from aluminum using photolithography and any suitable thin film techniques. At block 1904, a first electron transport layer is formed on the first cathode. Moving to block 1906, a first organic light emitting layer is formed on the first electron transport layer. At block 1908, a first hole injection layer is formed on the first organic light emitting layer. The first electronic transport layers, first organic light emitting layer, and first hole injection layer may be made using shadow masks and any suitable thin film techniques. Proceeding to block 1910, the shared anode is formed on the first hole injection layer. The shared anode may be made from ITO using photolithography and any suitable thin film techniques. In this example, an inverted OLED is formed on the glass substrate through blocks 1902-1910.

Moving to block 1912, a second hole injection layer is formed on the shared anode. At block 1914, a second organic light emitting layer is formed on the second hole injection layer. At block 1916, a second electron transport layer is formed on the second organic light emitting layer. The second electronic transport layers, second organic light emitting layer, and second hole injection layer may be made using shadow masks and any suitable thin film techniques. Proceeding to block 1918, a second cathode is formed on the second electron transport layer. The second cathode of the second light emitting element may be part of a second common cathode of the array of pixels. The second cathode may be made from ITO using photolithography and any suitable thin film techniques. In this example, a conventional OLED is formed on the inverted OLED and shares the same anode with the inverted OLED through blocks 1912-1918.

Figure 20:
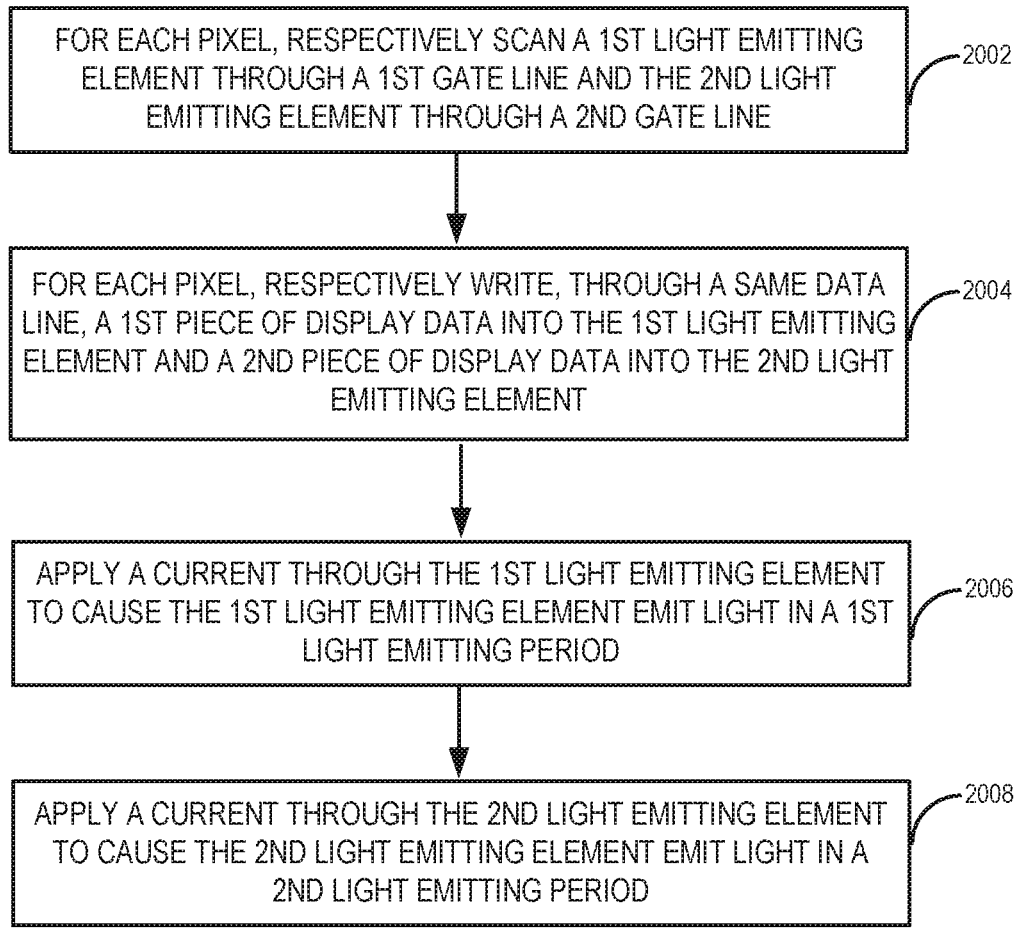
FIG. 20 is a flow chart illustrating a method for driving the display device shown in FIG. 4 in accordance with one embodiment set forth in the disclosure.

FIG. 20 is a flow chart illustrating a method for driving the display device in accordance with one embodiment set forth in the disclosure. It will be described with reference to the above figures. However, any suitable logic, units, or circuits may be employed. Beginning at block 2002, for each of the pixels, first and second light emitting elements are scanned through first and second gate lines, respectively. As described above, this may be performed by the gate driving unit 1204. At block 2004, for each of the pixels, through the same data line, first and second pieces of display data are written into the first and second light emitting elements, respectively. As described above, this may be performed by the data driving unit 1206. Moving to block 2006, a current is applied through the first light emitting element to cause the first light emitting element emit light in a first light emitting period. At block 2008, a current is applied through the second light emitting element to cause the second light emitting element emit light in a second light emitting period. The first light emitting element is formed on a substrate, and the second light emitting element is formed on the first light emitting element. The first and second light emitting elements share a same electrode. As described above, blocks 2006, 2008 may be performed by the driving circuit 1100, 1208.

Aspects of the method for making and driving a display device, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the software programming.

All or portions of the software may at times be communicated through a network such as the Internet or various other telecommunication networks. Such communications, for example, may enable loading of the software from one computer or processor into another. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-volatile storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Also, integrated circuit design systems (e.g. work stations) are known that create wafers with integrated circuits based on executable instructions stored on a computer readable medium such as but not limited to CDROM, RAM, other forms of ROM, hard drives, distributed memory, etc. The instructions may be represented by any suitable language such as but not limited to hardware descriptor language (HDL), Verilog or other suitable language. As such, the logic, units, and circuits described herein may also be produced as integrated circuits by such systems using the computer readable medium with instructions stored therein. For example, an integrated circuit with the aforedescribed logic, units, and circuits may be created using such integrated circuit fabrication systems. The computer readable medium stores instructions executable by one or more integrated circuit design systems that causes the one or more integrated circuit design systems to design an integrated circuit. The designed integrated circuit drives a display panel including an array of pixels, each of which including a first light emitting element and a second light emitting element. The designed integrated circuit includes a main switch and a plurality of auxiliary switches. The main switch is operatively connected to a first common cathode and a second common cathode of the array of pixels. Each of the plurality of auxiliary switches is operatively connected a shared anode of the first and second light emitting elements of each of the pixels. The integrated circuit is configured to alternatively apply a current through the first light emitting elements or the second light emitting elements of the array of pixels based on a control signal.

The above detailed description of the disclosure and the examples described therein have been presented for the purposes of illustration and description only and not by limitation. It is therefore contemplated that the present disclosure cover any and all modifications, variations or equivalents that fall within the spirit and scope of the basic underlying principles disclosed above and claimed herein.

What is claimed is:

1. A device for driving a display panel comprising an array of pixels, each of which comprising a first light emitting element and a second light emitting element, the device comprising:
    a timing controller configured to:
        provide a first set of timing control signals for coordinating timing of gate scanning and timing of writing display data into the array of pixels; and
        provide a second set of timing control signals for controlling timing of emitting light by the first and second light emitting elements of the array of pixels such that the first light emitting elements of the array of pixels emit light in a first light emitting period and the second light emitting elements of the array of pixels emit light in a second light emitting period, alternatively; and
    a gate driving unit configured to, for each of the pixels, respectively scan the first light emitting element through a first gate line and the second light emitting element through a second gate line different from the first gate line.

2. The device of claim 1, further comprising:
a data driving unit configured to, for each of the pixels, respectively write, through a same data line, a first piece of display data into the first light emitting element and a second piece of display data into the second light emitting element.

3. The device of claim 2, wherein in each frame period, the first and second light emitting elements of the array of pixels alternatively emit light after display data has been written into the array of pixels.

4. The device of claim 2, wherein in each frame period, the timing of emitting light is synchronized with the timing of gate scanning.

5. The device of claim 4, wherein a frequency of gate scanning is n times of a frequency of emitting light, where n is a positive integer.

6. The device of claim 1, wherein the first and second light emitting periods are substantially the same.

7. The device of claim 1, wherein the first and second light emitting elements emit light of different colors.

8. The device of claim 1, wherein:
the first light emitting element is formed on a substrate and the second light emitting element is formed on the first light emitting element;
the first and second light emitting elements share a same anode;
the first light emitting element comprises a cathode that is part of a first common cathode of the array of pixels; and
the second light emitting element comprises a second cathode that is part of a second common cathode of the array of pixels.

9. The device of claim 8, wherein the display panel further comprises:
a main switch operatively connected to the first and second common cathodes; and
a plurality of auxiliary switches, each of which being operatively connected to a corresponding shared anode of each of the pixels, the main switch and the plurality of auxiliary switches being controlled by the second set of timing control signals.

10. The device of claim 9, wherein the timing controller, in providing the second set of timing control signals, is further configured to provide a control signal to the main switch such that the main switch couples to one of the first and second common cathodes to form current paths between the corresponding first or second common cathode and the shared anodes of the array of pixels.

11. The device of claim 10, wherein the timing controller, in providing the second set of timing control signals, is further configured to provide the control signal to the plurality of auxiliary switches such that, for each of the pixels, the corresponding auxiliary switch couples to one of a first and second driving transistors that corresponds to one of the first and second light emitting elements.

* * * * *